United States Patent [19]

Solomon

[11] Patent Number: 5,013,687

[45] Date of Patent: May 7, 1991

[54] FRAMED CHIP HYBRID STACKED LAYER ASSEMBLY

[75] Inventor: Allen L. Solomon, Fullerton, Calif.

[73] Assignee: Grumman Aerospace Corporation, Bethpage, N.Y.

[21] Appl. No.: 385,356

[22] Filed: Jul. 27, 1989

[51] Int. Cl.$^5$ ............................................ H01L 21/60
[52] U.S. Cl. ..................................... 437/209; 437/51; 437/208; 437/915; 29/835; 29/837
[58] Field of Search ................. 437/209, 51, 915, 205, 437/925, 206, 208; 148/DIG. 164; 250/211 R; 29/835, 837, 839

[56] References Cited

U.S. PATENT DOCUMENTS

| | | | |
|---|---|---|---|
| 3,471,754 | 10/1969 | Hoshi et al. | 29/837 |
| 4,304,624 | 12/1981 | Carson et al. | 156/630 |
| 4,572,757 | 2/1986 | Spadafora | 29/837 |
| 4,618,763 | 10/1986 | Schmitz | 250/211 R |
| 4,659,931 | 4/1987 | Schmitz et al. | 250/370.08 |
| 4,660,066 | 4/1987 | Reid | 437/915 |
| 4,703,170 | 10/1987 | Schmitz | 250/211 |
| 4,761,681 | 8/1988 | Reid | 148/DIG. 164 |
| 4,792,672 | 12/1988 | Schmitz | 250/211 R |
| 4,794,092 | 12/1988 | Soloman | 437/225 |

Primary Examiner—Olik Chaudhuri
Assistant Examiner—Andrew Griffs
Attorney, Agent, or Firm—Stetina and Brunda

[57] ABSTRACT

A stacked integrated circuit assembly and method of fabricating the same are disclosed. The assembly includes a plurality of insulating substrate layers each supporting one or more embedded integrated circuit chips. The substrates each incorporate substantially identical conductive patterns formed on the insulating layer surface and/or on an insulating film that covers the substrate. A plurality of apertures are then formed which intersect the patterns, followed by insertion of IC chips into the apertures. The insulating layer is then cut to form a plurality of segments which are subsequently stacked vertically to form a module.

7 Claims, 6 Drawing Sheets

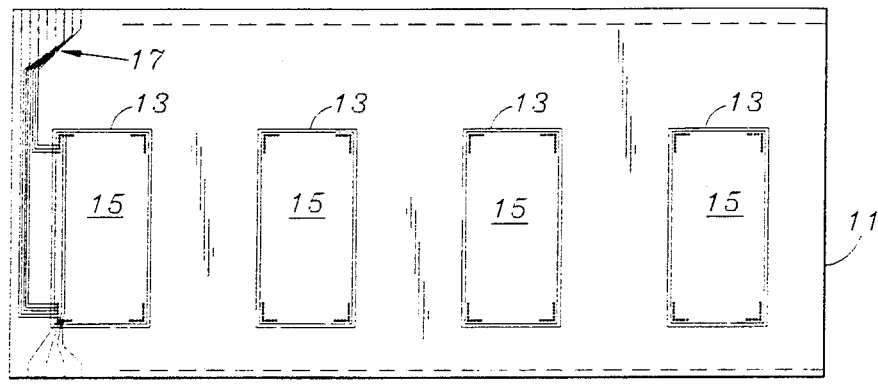
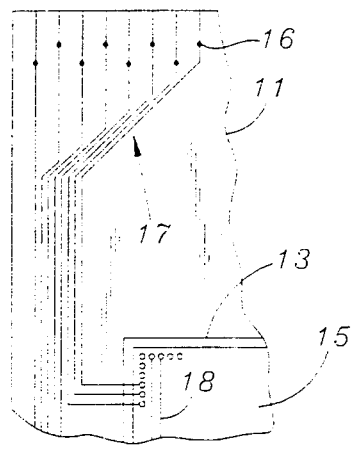
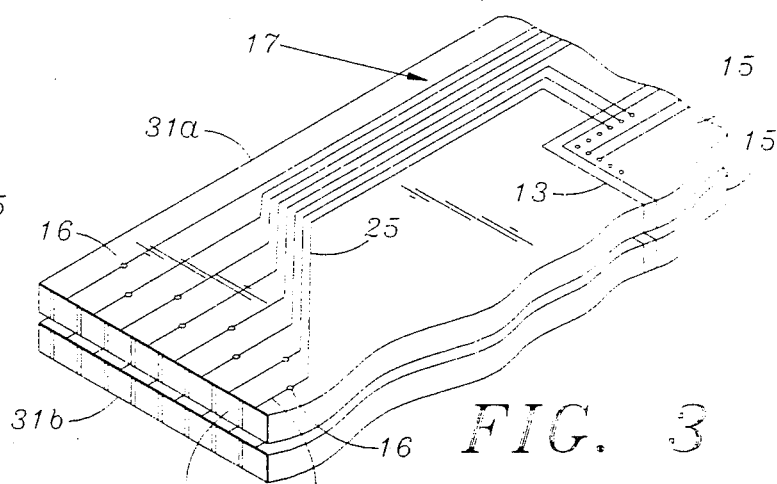
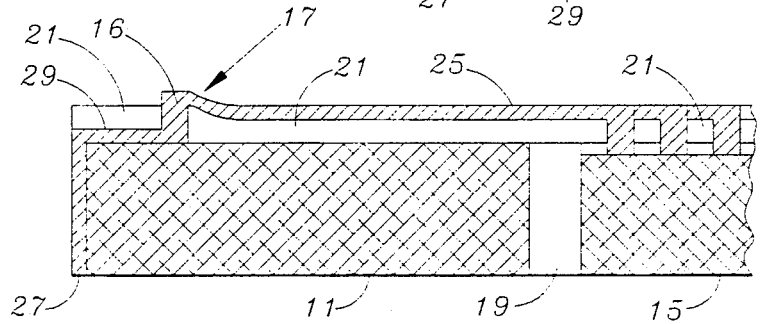

FRAMED CHIP HYBRID STACKED LAYER ASSEMBLY

BACKGROUND OF THE INVENTION

The present invention is directed to a multi-layer integrated circuit assembly for use in interfacing a planar array of input elements to external electronics.

The present invention finds application in relation to infrared detection circuits and, in particular, to large arrays of closely spaced infrared detector elements. Output signals from such elements must be separately received and processed in a reliable manner by supporting electronics. Though a certain amount of processing is preferably performed at or adjacent the focal plane, space and weight constraints typically limit the amount of such on focal plane processing that may be effected.

In order to address the connectivity and processing demands of electrically interfacing large arrays of closely spaced detectors a variety of techniques have been developed. Such prior techniques include the construction of various types of modules designed to support conductive patterns as well as a limited number of integrated circuits. One such module is disclosed in U.S. Pat. No. 4,304,624 to CARSON, ET.AL. The structure disclosed in that reference incorporates a base layer for supporting a plurality of integrated circuits and a plurality of adjacent layers formed to have apertures therein. In that construction distinct metalization patterns are formed on each of the layers, leading from edge portions of the layers to the apertures. The metalization patterns are then connected to dedicated integrated circuits by means of wire bonds and/or conductive vias vertically extending through the apertures formed in the stacked layers.

Though such a construction satisfies the connectivity and processing requirements of interfacing a closely spaced array of detector elements, leads and bonding pads require a large amount of layer area and a large number of bonding operations are needed. This method of connecting integrated circuits to the layers contributes to expense and potential reliability problems in the module.

In an alternate prior construction the insulating layers are eliminated and the integrated circuits are directly stacked. Such an approach is illustrated in U.S. Pat. No. 4,703,170 to SCHMITZ, assigned to the common assignee. Though this approach may be useful to eliminate the need to vertically communicate signals within the module, it requires that conductive patterns be formed directly on the integrated circuit substrate. That substrate may be formed of material such as bulk silicon or saphire depending upon performance requirements. The formation of conductive pads on vertical edges of the substrate may also be a tedious process in such a construction. Moreover, the wafer fabrication yield may be substantially reduced as the chip area is expanded to support the connectivity patterns.

Accordingly, it is desirable to develop a construction which avoids the vertical connection problems within a module without supporting the metalization patterns directly on the integrated circuit wafer. Moreover, it is desirable to provide a technique for forming such a module wherein each layer is of substantially the same construction and wherein wafer fabrication yield remains high. The present invention addresses these and other objects and disadvantages heretofore associated with the construction of contemporary multi-layer integrated circuit modules.

BRIEF DESCRIPTION OF THE DRAWING

FIG. 1a is a top view of an insulating substrate layer supporting a plurality of integrated circuits and a representative conductive pattern portion;

FIG. 1b is an enlarged view of a portion of FIG. 1a;

FIG. 2 is a cross sectional view of a module segment formed in accordance with the present invention;

FIG. 3 is a top perspective view of a module segment formed in accordance with the present invention;

SUMMARY OF THE INVENTION

Figure 4A:
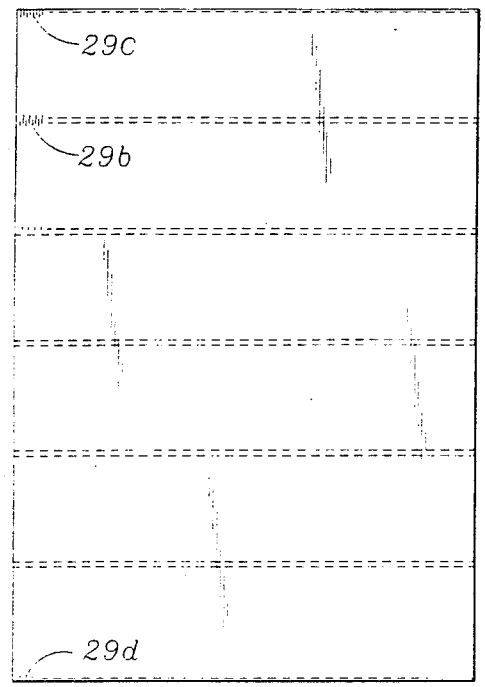
FIG. 4a illustrates a step in the sizing of an insulating substrate layer to form a plurality of module segments.

A stacked integrated circuit assembly and method of fabricating the same are disclosed. The assembly includes a plurality of insulating substrate layers each supporting one or more embedded integrated circuit chips. The substrates each incorporate substantially indentical conductive patterns formed on the insulating layer surface and/or on an insulating film that covers the substrate.

In the presently preferred embodiment the conductive pattern is formed partially upon the surface of the insulating substrate and partially upon an insulating film formed to extend along the surface of the substrate and the embedded integrated circuit. Windows are formed in the insulating film to facilitate electrical connection between the conductive pattern and the integrated circuit. Bonding pads are formed on edge surfaces of the insulating substrate to connect the conductive pattern to a planar array of detector elements and/or external processing electronics.

The integrated circuits are disposed in apertures formed in the insulating substrate, held in place by an adhesive layer surrounding the integrated circuit.

The assembly may be formed such that each layer comprises an integrated substrate incorporating a plurality of integrated circuit chips.

The insulating substrate may be formed of alumina ceramic or other material suitable to form thin layers with sufficient structural and electrical qualities.

DETAILED DESCRIPTION OF THE PRESENTLY PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for construction of the invention in connection with the illustrated embodiment. It is to be understood, however, that the same or equivalent functions and sequences may be accomplished by different embodiments that are also intended to be encompassed within the spirit and scope of the invention.

FIG. 1a illustrates a top view of an insulating substrate layer formed to receive and support a plurality of integrated circuits. As described in more detail below, the insulating layer may be cut to form a plurality of apertures for receiving integrated circuits, and supporting metalization patterns leading to and from each of the integrated circuits. Optionally, the insulating layer may then be again cut to form segments, each supporting an integrated circuit and a substantially identical metalization pattern. The layers or segments may then be vertically stacked to form a modular integrated circuit assembly.

FIG. 1a illustrates a portion of substrate 11 formed to include the plurality of substantially identical rectangular apertures 13. Within each aperture 13 is disposed an integrated circuit 15. In the presently preferred embodiment each of the integrated circuits 15 is formed of substantially identical construction. A metallization pattern, such as the metal pattern portion 17, for communicating signals to and from each of the integrated circuits 15, is formed partially on substrate 15, through vias in a thin insulator film blanket, over the blanket and then through another set of vias to pads on the integrated circuits 15.

It is to be understood that metalization pattern portion 17 represents approximately one-half (i.e. the left half) of the upper metalization pattern leading to and from each of the integrated circuits 15. The other half of the metalization pattern portion 17 (not shown) is typically a mirror image of the illustrated metalization pattern. Moreover, as further described below, the pattern is repeated for each of the integrated circuits 15.

FIG. 1b is an enlarged view of a portion of FIG. 1a, illustrating in greater detail the metalization pattern portion 17. As shown therein the metalization pattern portion 17 includes a plurality of lines, each extending from an edge of substrate 11 to a dedicated pad formed on the surface of integrated circuit 15. As further shown at FIG. 2 the metalization pattern portion 17 extends from lead 29 through vias 16 to the surface of an insulating film blanket and over the film blanket 21. In certain cases the metalization pattern may include additional segments such as segment 18, (see FIG. 1b) extending intermediate pads formed on integrated circuit 15. As will be recognized by one of ordinary skill in the art the precise connection pattern will depend upon the particular application and the construction of the particular integrated circuit utilized. Formation of the individual segments is described in more detail below.

FIG. 2 is a cross-sectional view of a segment of the layer 11. The illustrated construction includes insulating layer 11 and integrated circuit 15. An adhesive layer 19 is disposed intermediate the layer 11 and integrated circuit 15, and serves to bond the integrated circuit in place within aperture 13. An insulating film 21 forms a blanket over the insulating layer 11, the adhesive layer 19 and on the surface of the integrated circuit 15. Metalization pattern segment 25 extends along the surface of insulating layer 11 above the insulating film 23 and is connected to the integrated circuit 15. Metalic pad 27 is formed on a vertical edge surface of the insulating layer 11 to facilitate communication between the metalization pattern and external electronic components, either detector array elements or external processing. The metalic pad 27 is connected to conductive lead 25 by lead 29 and via 16.

FIG. 3 is a partial illustration of a stacked pair of insulating layer segments 31a, 31b. Construction of each of the layer segments is described in more detail below. Each of the layer segments 31a and 31b have a substantially identical construction. Each segment incorporates an aperture 13, within which is disposed an integrated circuit 15. A substantially identical metalization pattern 17 is formed on the surface of each segment 31a and 31b.

Figure 4B:
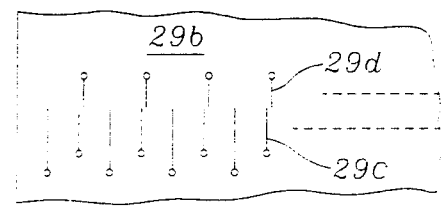
FIG. 4b is an enlarged view of a portion of FIG. 4a illustrating a portion of the conductive pattern formed on the surface of the insulating substrate layer.

FIGS. 4a and 4b illustrate the initial steps in construction of an assembly in accordance with the present invention. The insulating layer 11 at FIG. 4a provides sufficient substrate area to be segmented eventually into multiple layers as described herein. As shown in more detail at FIG. 4b, leads 29 are formed at the upper and lower edge portions of each of the eventually cut out segments. The particular lead pattern 29b illustrated at FIG. 4b is typically utilized where the number of integrated circuit connections 29d to the external processing electronics is fewer than the number of connectors 29c extending between the integrated circuit and the detector array elements. However, it is to be understood that the selection of particular lead patterns is a matter of design choice in view of the particular application and equipment with which the invention is utilized. Moreover, it is to be understood that the lead patterns 29 are typically repeated along upper and lower boundaries of each segment of insulating layer 11.

Figure 5:
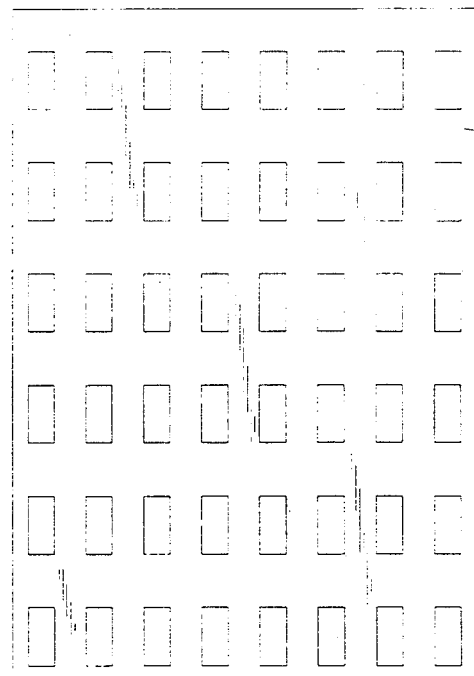
FIG. 5 illustrates the formation of apertures within the insulating substrate layer viewed from the bottom.

A plurality of apertures are then formed in the surface of insulating substrate layer 11. The formation of the apertures 13 in the insulating substrate layer 11 viewed from the underside is illustrated at FIG. 5. It is to be understood that the number of apertures is a matter of design choice in view of the size of the insulating layer 11, the size of the integrated circuits to be used, leads and via window area requirements and production efficiencies. In the illustrated embodiment forty-eight apertures are formed in the substrate 11.

Figure 6:
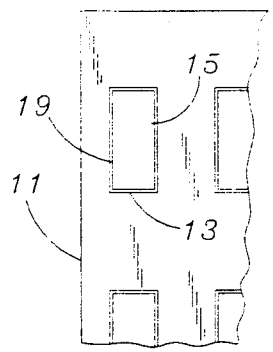
FIGS. 6 is a bottom view of the placement of integrated circuits within apertures formed in the insulating substrate layer.
Figure 7:
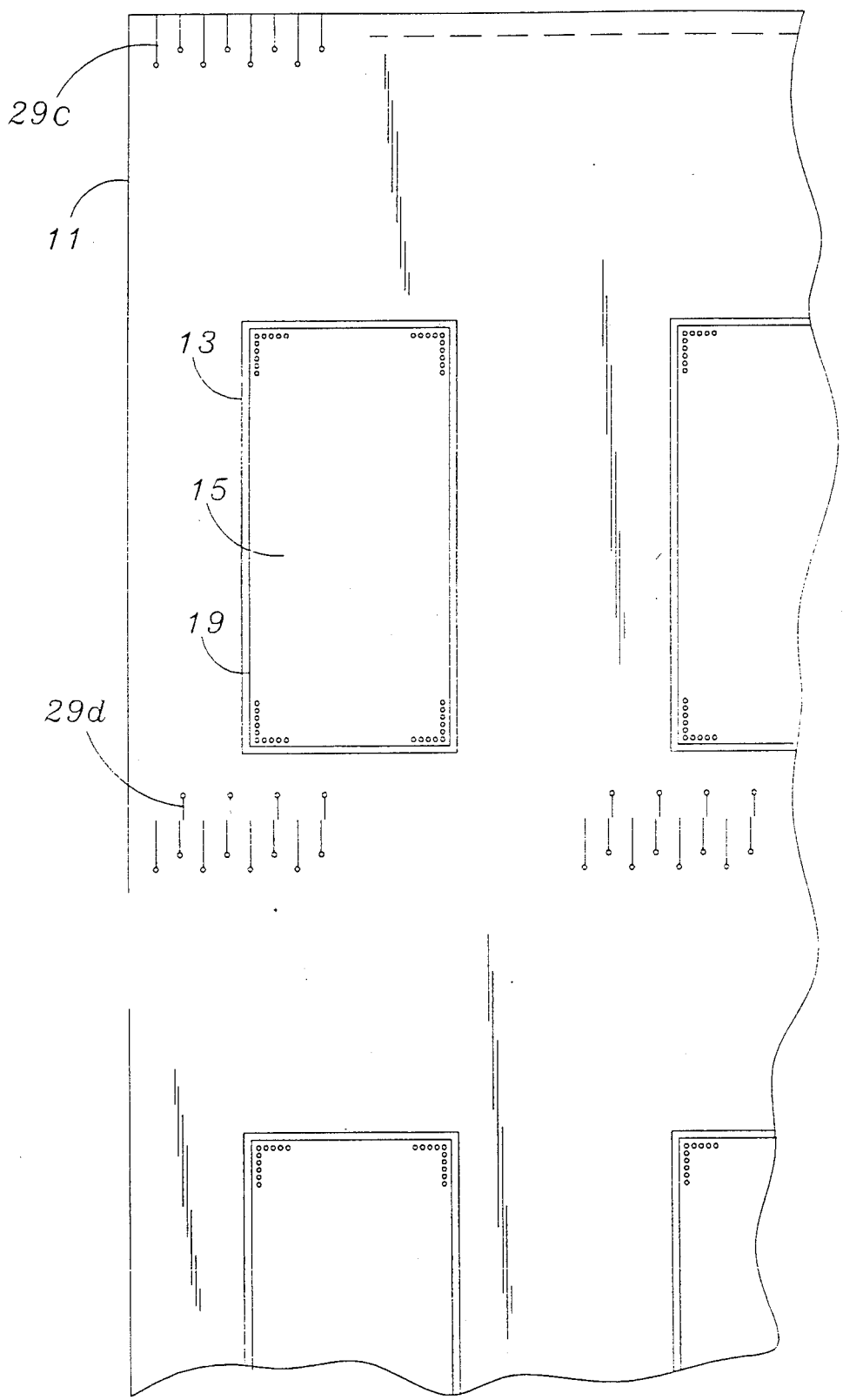
FIG. 7 is a top view illustrating the placement of integrated circuits within apertures formed in the insulating layer.

FIG. 6 illustrates an enlarged portion of the layer 11 with integrated circuit chips 15 disposed face down in the apertures 13. The chips 15 are edge sealed and groove filled to the aperture walls in layer 11 with an adhesive resin 19. The view set forth at FIG. 6. like FIG. 5, is from the underside of the layer 11. FIG. 7 is a top view of the construction illustrated at FIG. 6.

Figure 8A:
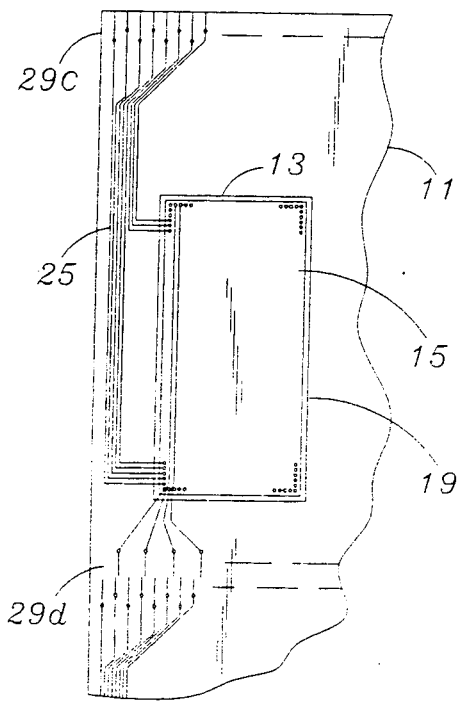
FIG. 8a is a top view of the metal film connection pattern which results after a thin insulating film blanket is formed on the substrate layer.
Figure 8B:
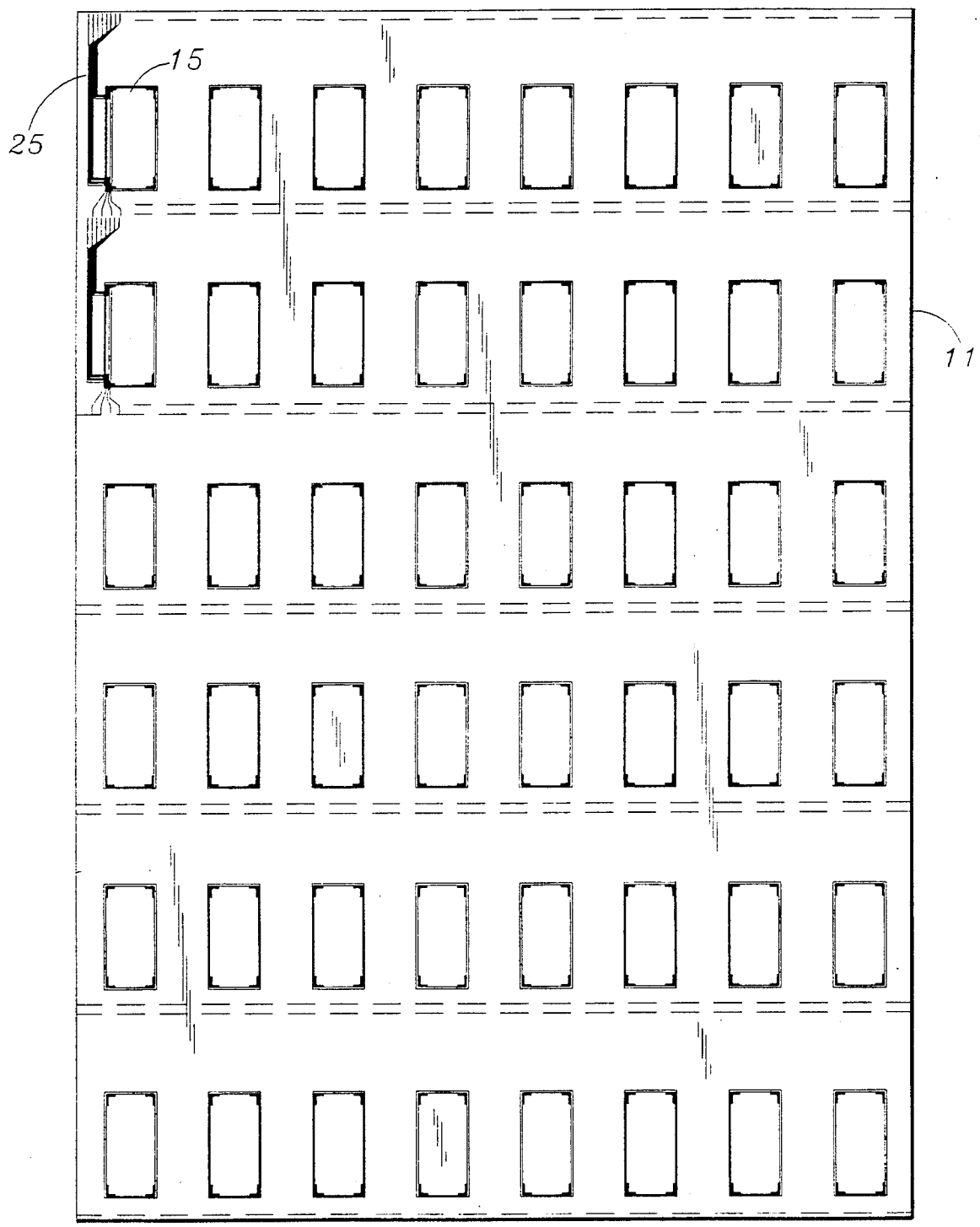
FIGS. 8b is a top view of the insulating substrate layer.

As previously noted in connection with FIG. 2. a thin insulating film 21 is applied to the top surface. Windows are opened in the film for vias 16 and for integrated circuit chip 15 contact pads. Metal is deposited and leads 25 are patterned as shown at FIG. 8a. The process as repeated along the entire layer substrate 11 is represented at FIG. 8b. Multiple segments, e.g. twelve, each like that shown at FIG. 1a, are cut from the substrate. These segments are then adhesively bonded in a stack. Metal bonding pads 17 are formed on a stack face.

Figure 11A:
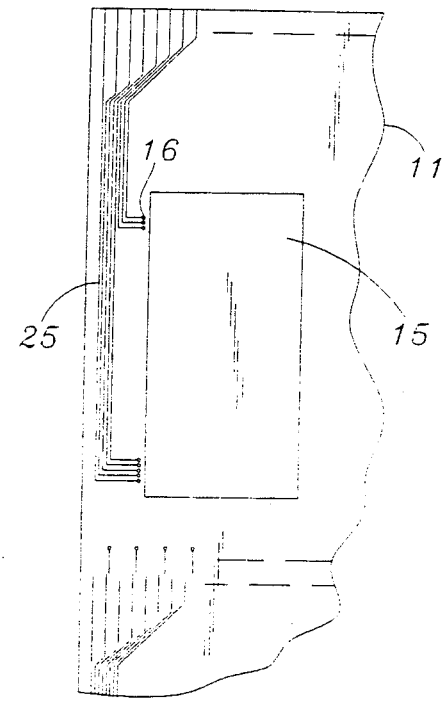
FIGS. 11a and 11b are top views of the extended metal pattern to be compared to FIGS. 4a, 4b and 7.
Figure 12:
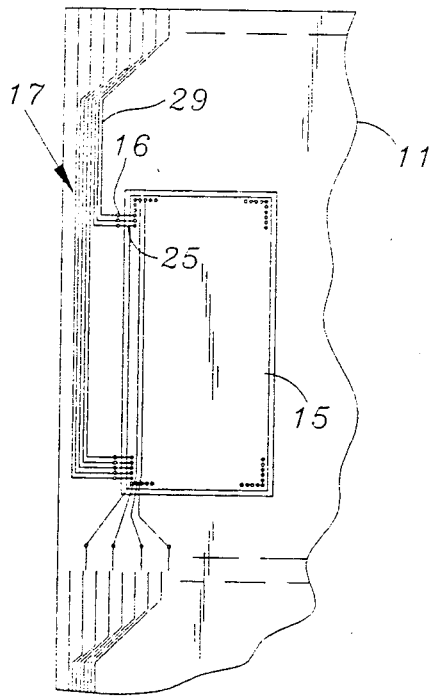
FIG. 12 is a top view of the complete extended metal pattern.
Figure 11B:
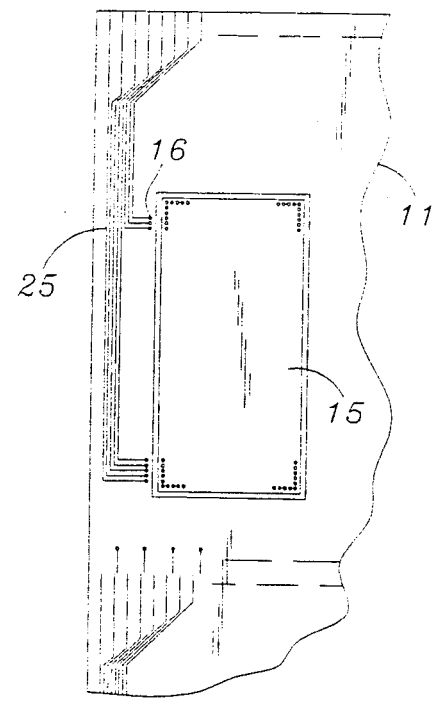
Figure 9:
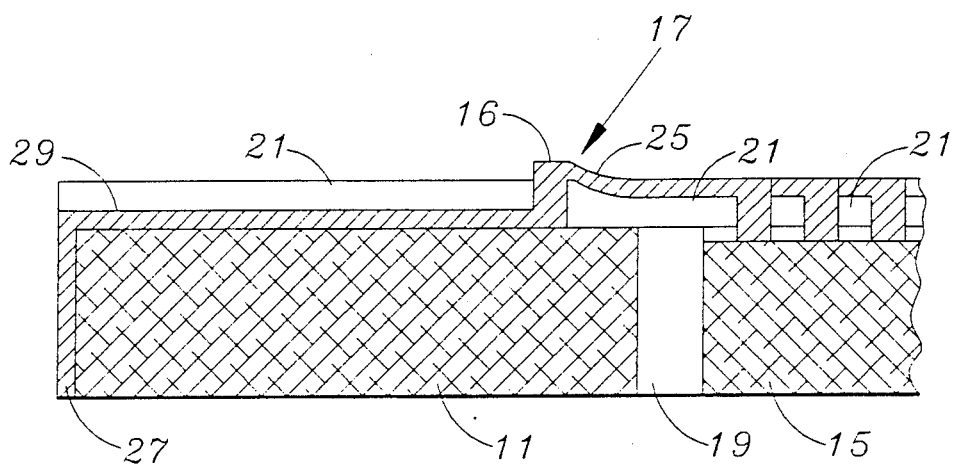
FIG. 9 is a cross sectional view of the module, similar to FIG. 2, with an extended metal pattern on the insulating layer and a shortened pattern on the insulating film.
Figure 10:
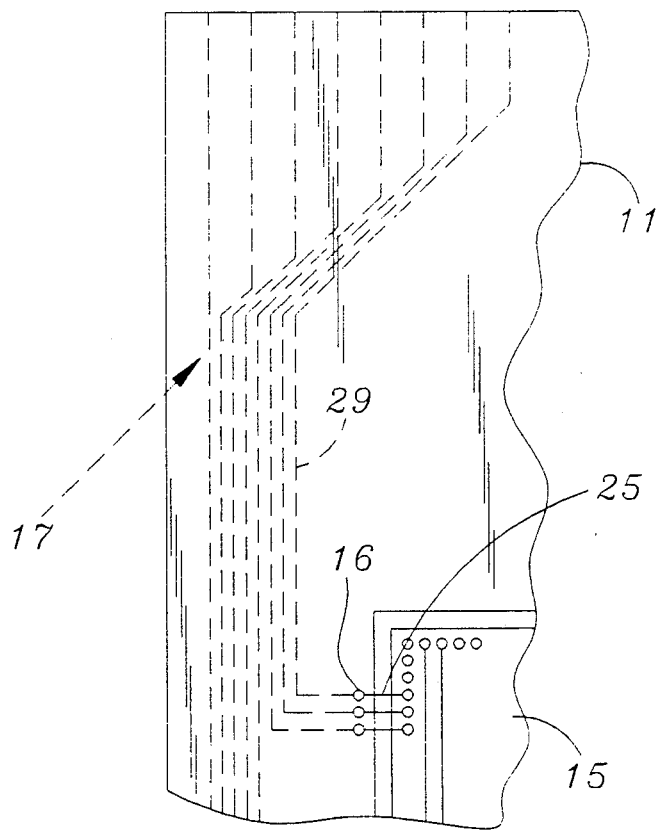
FIG. 10 is a top view of the extended metal pattern on the insulating layer.

As may be appreciated from review of FIG. 9, twice the lead area is available by patterning leads from an upper or lower input/output edge on the insulating layer substrate 11 as well as on the insulating film 21. (Compare length of leads 29 in FIG. 9 to that at FIG. 2.) In FIG. 9 the leads 29 are extended to vias 16, which are located closer to the integrated circuit chip. Short leads 25 go from the vias to the chip contact pads. The extended lines 29 on the substrate layer 11 are shown as dashed lines at FIG. 10 and as solid lines at FIG. 12. This may be compared to the shorter leads 29 shown at FIG. 1b. The extended lines 29 are further shown by FIGS. 11a and 11b. The same conductive pattern 17 may be formed on either the lower surface (see FIG. 11a) or the upper surface (see FIG. 11b) of substrate 11.

Having reviewed the construction of the invention the description below describes the presently preferred technique for forming the multi-layer assembly and is to be construed in conjunction with the previously described structure.

The layer fabrication procedure commences with the formation of the insulating substrate layer 11. Lead lines 29, serving as input/output connections for the individual integrated circuits may be formed by vapor deposition and photolithographic patterning on the surface of the insulating layer 11.

In the presently preferred embodiment the insulating layer 11 is formed to be approximately 1 inch in width, 3 inches in length, and 0.005 inches thick.

The insulating layer 11 is then laser profiled to form a frame pattern as illustrated at FIG. 5. Rectangular apertures are formed in the pattern which receive the integrated circuits. In the presently preferred embodiment the apertures are formed to be approximately 0.25 inches long and 0.12 inches wide. The profiled insulating layer 11 is then temporarily adhered face down to a flat plate and the integrated circuit chips, which have been wafer thinned and tested are placed face down in the apertures, as shown at FIG. 6. The groove about the integrated circuit is then filled, in whole or in part with an adhesive resin such as epoxy. The location of the integrated circuit 15 within the aperture 13 is performed with sufficient accuracy to enable contact windows to be reliably formed by photolithography in an insulating film covering the manufactured integrating circuit. The insulating substrate layer, with the embedded chips 15, is released from the flat surface and cleaned. Thin film 21, approximately 60 microinches thick, such as a polymide plastic, is applied to the exposed top face of the substrate. Via and integrated circuit chip contact windows are opened in the film. A metal film is deposited, e.g., by vacuum deposition on the exposed face. Leads and contacts 25 are patterned or defined photolithographically. This completes the metal lead and contact pattern 17.

The layer 11 may then be cut, e.g., by sawing, into a plurality of horizontal segments, each including at least one integrated circuit and the associated metalization pattern. The segments may then be adhesively stacked and contact pads 27 formed on the vertical face edge surfaces. A first edge of the stacked assembly may then be disposed in abutting electrical connection to an array segment. A second edge portion may be disposed in abutting electrical connection to a header for facilitating connections between the integrated circuit and external processing electronics.

It is to be understood that the number of integrated circuits incorporated into this stacked assembly is a matter of design choice in view of the physical and functional requirements of a particular application. Moreover, the particular method of forming the metalization pattern and securing the integrated circuit within the aperture are matters of design choice and may also be varied without departing from the broader aspects of the present invention.

What is claimed is:

1. A method of forming a multi-layer module comprising:
    forming a plurality of substantially identical conductive patterns on a first surface of an insulating wafer;
    forming a plurality of apertures in the insulating wafer, each of said apertures intersecting a dedicated one of the plurality of conductive patterns;
    inserting an integrated circuit chip within each of the apertures;
    electrically connecting the integrated circuit chip to a dedicated portion of the conductive pattern;
    cutting the insulating layer to form a plurality of layer segments; and
    vertically stacking the segments such-that the integrated circuits and conductive patterns are in substantial vertical registration to form a module.

2. The method as recited in claim 1 further comprising the step of:
    forming a first portion of the conductive pattern upon the surface of the substrate;
    forming an insulating layer upon the substrate, the integrated circuit chip and the conductive pattern first portion; and
    forming a second portion of the conductive pattern upon the insulating layer.

3. The method as recited in claim 2 further comprising the step of connecting the first and second portions of the conductive pattern.

4. The method as recited in claim 3 further comprising the step of selectively removing a portion of the insulating layer prior to connecting the second portion of the conductive pattern to the integrated circuit chip.

5. The method as recited in claim 1 further comprising the step of forming conductive pads on a first vertical edge portion of the layer segments to facilitate abutting electrical connection between the module and a planar array of photodector elements.

6. The method as recited in claim 1 further comprising the step of adhesively bonding the integrated circuits within the apertures.

7. The method as recited in claim 1 further comprising forming conductive pads on second vertical edge surfaces of the layer segments for communicating electrical communication between the integrated circuits and external control and signal processing circuitry.

* * * * *